United States Patent
Gunturi et al.

(10) Patent No.: US 10,505,582 B2
(45) Date of Patent: Dec. 10, 2019

(54) SIGNAL COMPRESSION FOR SERIALIZED SIGNAL BANDWIDTH REDUCTION

(71) Applicant: TEXAS INSTRUMENTS INCORPORATED, Dallas, TX (US)

(72) Inventors: Sarma Sundareswara Gunturi, Karnataka (IN); Jaiganesh Balakrishnan, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/934,946

(22) Filed: Mar. 23, 2018

(65) Prior Publication Data
US 2019/0068238 A1    Feb. 28, 2019

(30) Foreign Application Priority Data
Mar. 23, 2017  (IN) .............................. 201741010243

(51) Int. Cl.
| | |
|---|---|
| *H04B 1/66* | (2006.01) |
| *H04B 1/62* | (2006.01) |
| *H04B 1/04* | (2006.01) |
| *H03M 7/30* | (2006.01) |
| *H03M 7/24* | (2006.01) |

(52) U.S. Cl.
CPC ............ *H04B 1/66* (2013.01); *H03M 7/6005* (2013.01); *H03M 7/6011* (2013.01); *H04B 1/04* (2013.01); *H04B 1/62* (2013.01); *H03M 7/24* (2013.01); *H04B 2001/0425* (2013.01)

(58) Field of Classification Search
CPC ... H04B 1/66; H04B 1/04; H04B 1/62; H04B 2001/0425; H03M 7/6005; H03M 7/6011; H03M 7/24
See application file for complete search history.

(56) References Cited

U.S. PATENT DOCUMENTS

| | | | | |
|---|---|---|---|---|
| 6,038,369 | A * | 3/2000 | Imai ................ | G11B 20/00007 360/22 |
| 9,800,272 | B2 * | 10/2017 | Hezar ...................... | H04B 1/04 |
| 2018/0192229 | A1 * | 7/2018 | Easley .................... | H04S 7/307 |

* cited by examiner

*Primary Examiner* — Sophia Vlahos
(74) *Attorney, Agent, or Firm* — John Pessetto; Charles A. Brill; Frank D. Cimino

(57) ABSTRACT

Signal compression for serialized data bandwidth reduction based on decomposition of a data signal into separate signal components with different SQNR or dynamic range requirements, and quantizing the signal components with different bit precisions. Compression logic decomposes the input data signal into the first/second signal components, quantizes the first component with a pre-defined first bit precision to provide a first quantized data signal, quantizes the second component with a pre-defined second bit precision to provide a second quantized data signal, the second bit precision less than the first bit precision, the first and second quantized data signals bit packed into a compressed digital data signal. At the receive-end, decompression logic bit unpacks the compressed digital data signal into the first/second quantized data signals, and filters/combines the first/second quantized data signals into a decompressed data signal corresponding to the input data signal including the first and second signal components.

22 Claims, 8 Drawing Sheets

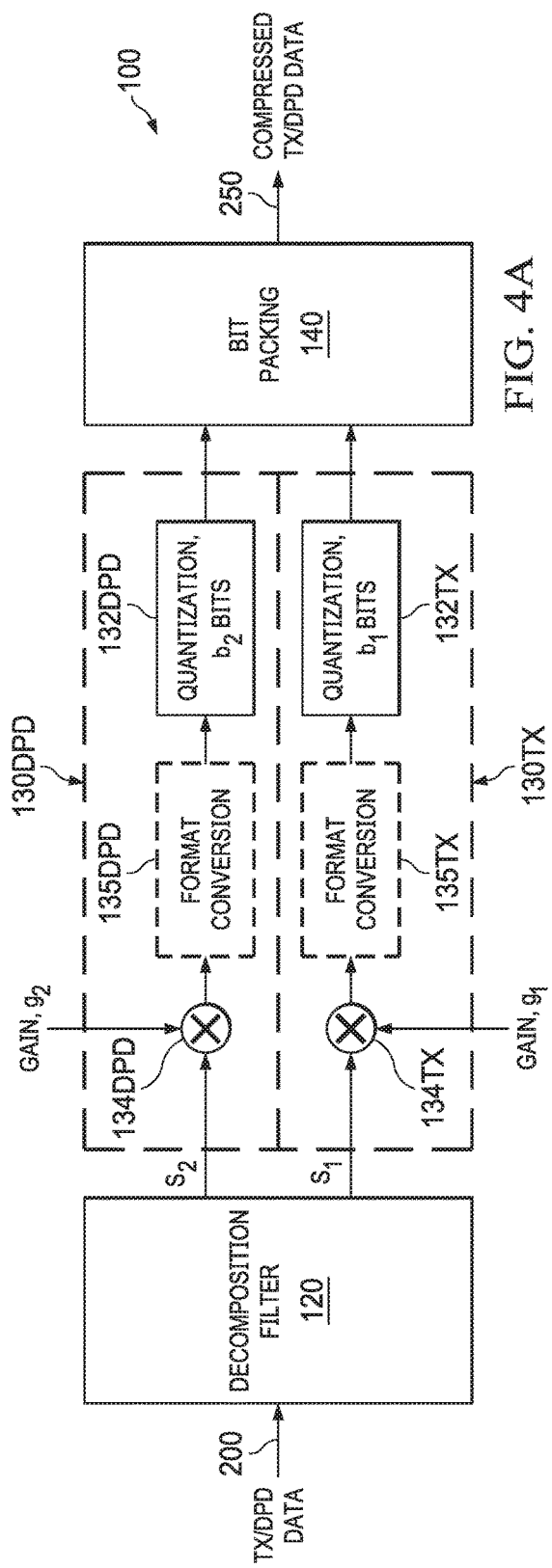
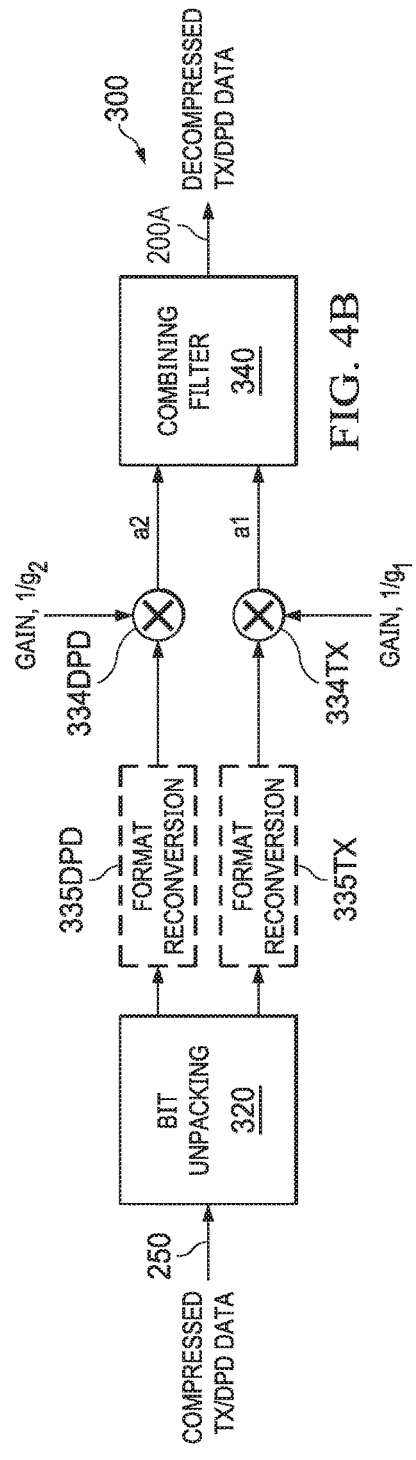
FIG. 4A
FIG. 4B

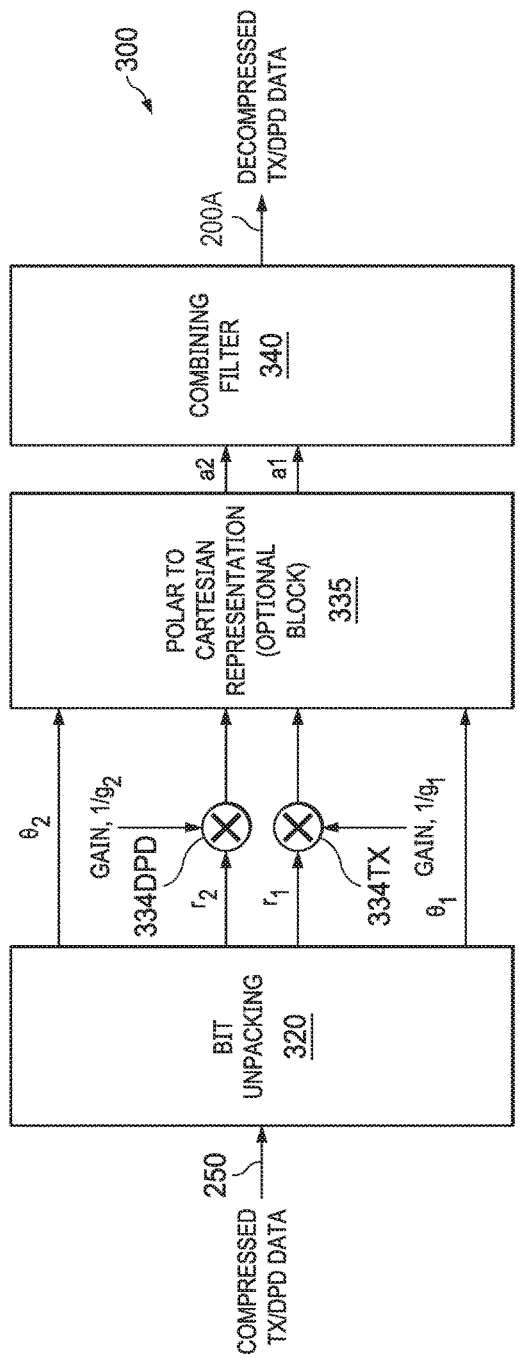
FIG. 6B
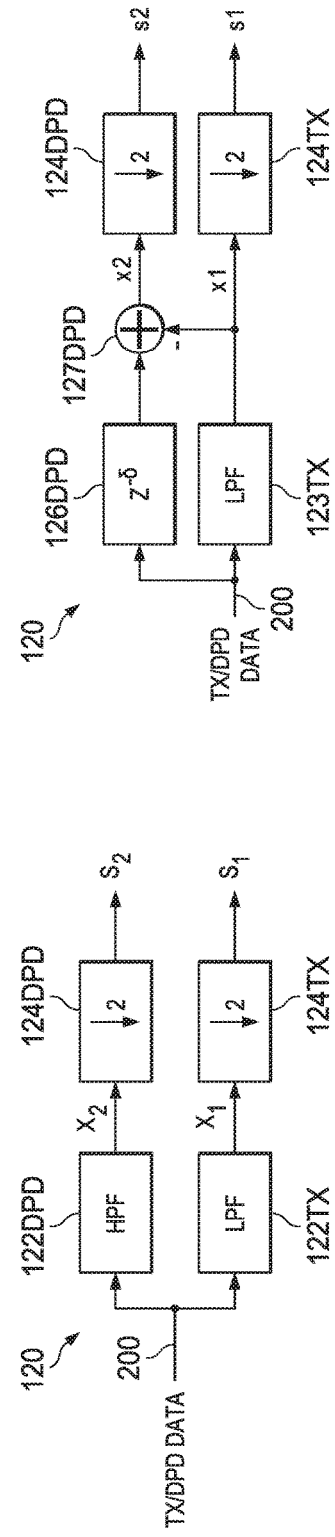
FIG. 7A
FIG. 7B

SIGNAL COMPRESSION FOR SERIALIZED SIGNAL BANDWIDTH REDUCTION

CROSS-REFERENCE TO RELATED APPLICATIONS

Priority is claimed under 37 CFR 1.78 and 35 USC 119(e) to INDIA Provisional Application 201741010243 (TEMP/E-1/10449/2017-CHE), filed 2017 Mar. 23, which is incorporated by reference in its entirety.

BACKGROUND

In wireless infrastructure, an RF transmitter TX can include a TX baseband device (ASIC) that transmits TX (digital) data to an analog front end (AFE) device over a serializer-deserializer (SerDes) com link. The AFE converts the serialized TX data, and transmits through a TX RF signal path including upconversion to RF, and transmit through a TX PA (power amplifier). The TX baseband ASIC can be implemented in a transceiver TX/RX that includes a receiver RX baseband device, with a TX/RX AFE and bi-directional TX/RX SerDes com link.

The TX baseband device commonly include DPD (digital pre-distortion) processing of the TX data to compensate for signal path nonlinearities, primarily in the PA. To calibrate/adjust DPD, the TX baseband device commonly includes a feedback channel, such as through a feedback receiver FBRX, for observing the AFE TX output through the TX PA, with the SerDes com link providing TX and RX SerDes data lanes.

TX DPD results in approximately 5× bandwidth expansion, increasing the TX data bandwidth required over the SerDes com link.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods signal compression for serialized signal bandwidth reduction, such as can be used for serial data communication between a digital baseband transmitter/transceiver and an analog front end to a radio frequency transmitter. Signal compression for serialized data bandwidth reduction, is based on decomposition of a data signal into separate signal components with different SQNR or dynamic range requirements, and quantizing the signal components with different bit precisions.

According to aspects of the Disclosure, a communications link includes at a transmit end a transmit interface, and at a receive end a receive interface. The transmit interface includes a data input to receive an input data signal with at least first and second signal components with respectively a higher and a lower SQNR (signal to quantization noise ratio) requirement or lower dynamic range requirement. Compression logic includes (a) decomposition logic to decompose the input data signal into the first and second signal components, (b) quantization logic to quantize the first signal component with a pre-defined first bit precision to provide a first quantized data signal, and to quantize the second signal component with a pre-defined second bit precision to provide a second quantized data signal, the second bit precision less than the first bit precision, and (c) bit-packing logic to assemble the first and second quantized data signals into a compressed digital data signal. The receive interface includes a com input to receive the compressed digital data signal. Decompression logic includes (a) bit unpacking logic to separate the compressed digital data signal into the first and second quantized data signals, and (b) combining filter logic to combine the first and second quantized data signals into a decompressed data signal corresponding to the input data signal including the first and second signal components.

In other aspects of the disclosure, an analog front end (AFE) can be used in a system including a radio frequency digital baseband transmitter interfaced at a transmit end to a communications link, the transmitter to generate a radio frequency compressed baseband digital data signal. The AFE includes a receive interface including an input com port to interface at a receive end to the communications link. The receive interface is configured to receive through the input com port the compressed baseband digital data signal communicated over the communications link, the compressed baseband digital data signal generated from a radio frequency baseband discrete data signal that includes a TX inband signal component, and a DPD signal component based on digital pre-distortion of the TX inband signal component. The TX inband signal component is quantized with a pre-defined first bit precision to provide a TX quantized data signal, and the DPD signal component quantized with a pre-defined second bit precision to provide the DPD quantized data signal, where the second bit precision less than the first bit precision. The compressed baseband digital data signal is generated with the TX and DPD quantized data signals. Decompression logic includes (a) bit unpacking logic to separate the compressed baseband digital data signal into the TX and DPD quantized data signals, (b) combining filter logic to filter the TX and DPD quantized data signals into TX and DPD filtered data signals, combined into a decompressed baseband digital data signal corresponding to the radio frequency baseband digital data signal including the TX and DPD signal components, and (c) radio frequency conversion circuitry to convert the decompressed baseband digital data signal to an analog radio frequency signal corresponding to the radio frequency baseband discrete data signal including the TX inband and DPD signal components.

In other aspects of the Disclosure, a method of communicating digital data over a communications link provides signal compression for serialized signal bandwidth reduction. At the transmit end, the method can include: (a) receiving an input data signal with at least first and second signal components with respectively a higher and a lower SQNR (signal to quantization noise ratio) requirement or lower dynamic range requirement; (b) decomposing the input data signal into the first and second signal components, quantizing the first signal component with a pre-defined first bit precision to provide a first quantized data signal, and quantizing the second signal component with a pre-defined second bit precision to provide a second quantized data signal, the second bit precision less than the first bit precision, and (c) bit-packing the first and second quantized data signals into a compressed digital data signal. At the receive end, the method can include: (a) receiving the compressed digital data signal; (b) bit-unpacking the compressed digital data signal into the first and second quantized data signals; and (c) combining the first and second quantized data signals into a decompressed data signal corresponding to the input data signal including the first and second signal components.

Other aspects and features of the invention claimed in this Patent Document will be apparent to those skilled in the art from the following Disclosure.

BRIEF DESCRIPTION OF THE DRAWINGS

FIGS. 3A and 3B illustrate example TX interface 100 and AFE interface 300: FIG. 3A illustrates an example TX interface 100 including decomposition 120 into separate TX (Inband) and DPD components s1 and s2, which are processed through separate data paths 130TX and 130DPD, including quantization 132TX and 132DPD with separate bit precisions b1 and b2 after, in this example, being gained up 134TX/g1 and 134DPD/g2, followed by bit packing 140 to output a compressed TX/DPD data stream for transmission over a SerDes link; and FIG. 3B illustrates an example AFE interface 300 to receive the compressed TX/DPD data, which is unpacked 320 into the separate TX and DPD data components a1 and a2, and, in this example, separately scaled by 334TX/334DPD with inverse gains 1/g1 and 1/g2, followed by combining 340 into decompressed TX/DPD data 200.

FIGS. 4A and 4B illustrate alternate example TX interface 100 and AFE interface 300, including format conversion (from IQ Cartesian) in the data paths: FIG. 4A illustrates an example TX interface 100 including in the separate data paths 130TX and 130DPD, format conversion 135TX and 135DPD (such as floating point or polar); and FIG. 4B illustrates an example AFE interface 300 to receive compressed TX/DPD data, and processed with format reconversion (back to IQ Cartesian), into decompressed TX/DPD data 200.

FIGS. 6A and 6B illustrate an example implementation of TX interface 100 and AFE interface 300 of FIGS. 4A and 4B with format conversion from IQ Cartesian to a polar representation.

FIGS. 7A, 7B, 7C illustrate example implementations for decomposition filtering for use in the example TX interface 100 of FIGS. 3A, 4A. 5A, 6A (120).

DETAILED DESCRIPTION

This Description and the Drawings constitute a Disclosure for signal compression for serialized data bandwidth reduction, based on decomposition of a data signal into separate signal components with different SQNR or dynamic range requirements, and quantizing the signal components with different bit precisions (such as for data transmission over a serial link), including describing design examples (example implementations), and illustrating various technical features and advantages.

Figure 1:
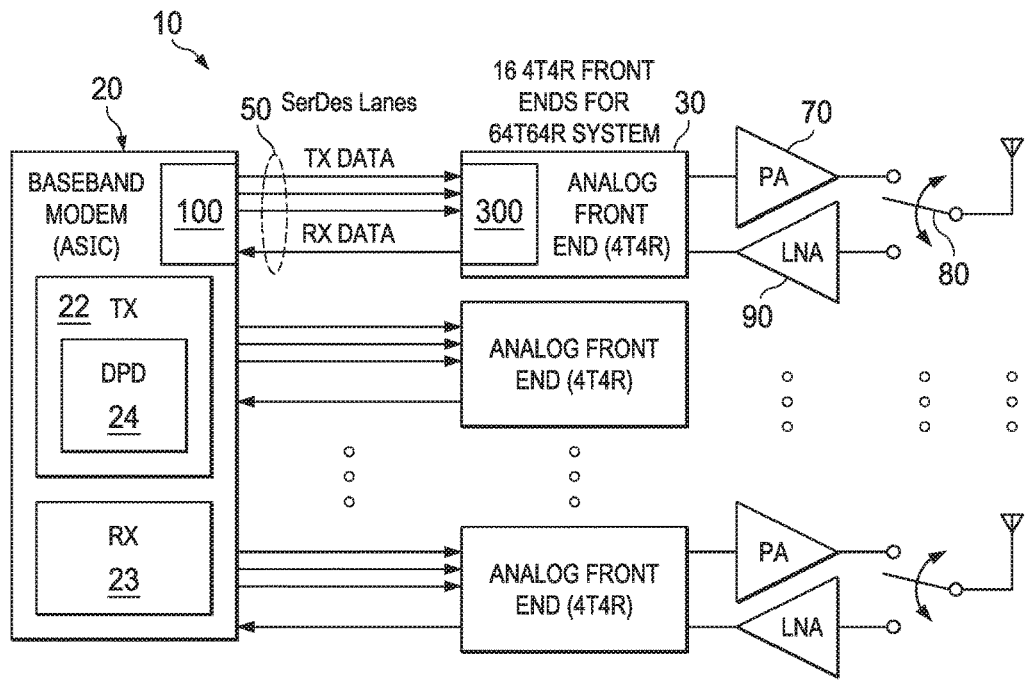
FIG. 1 illustrates an example wireless system 10 with a TX/RX transceiver 20 (baseband modem) interfaced to an AFE 30 over a SerDes com link 50, the TX/RX including a TX 22 that provides TX data with DPD, and the SerDes com link 50 including interfaces TX/RX 100 and AFE 300.

FIG. 1 illustrates an example application for reducing serialized data bandwidth through signal compression according to the disclosure. An example wireless system 10 includes a TX/RX transceiver 20 (baseband modem) interfaced to an AFE 30 over a SerDes com link 50. The SerDes com link provides TX and RX data communication channels through a TX/RX interface 100 and an AFE interface 300.

The AFE includes TX and RX signal chains: the TX chain converts TX quadrature (IQ) digital data received over the SerDes interface to RF, with upconversion and filtering, such as for QMC (quadrature mismatch compensation), and RF transmission through a PA (power amplifier) 70; the RX chain receives RF transmission through an LNA (low noise amplifier) 90, providing downconversion and QMC filtering, and conversion to serial digital data for communication to the TX/RX 10 over the SerDes link 50.

The TX/RX transceiver includes a transmitter 22 that generates TX data with DPD (digital pre-distortion) to compensate for signal path nonlinearities, primarily in the PA 70. This data signal is referred to as a TX/DPD data/ signal (which has TX Inband and DPD bandwidth expansion components). AFE 30 provides a feedback channel for providing PA RF output back to the TX 22 for DPD calibration/update.

Wireless system 10 is illustrated as a multiple-input multiple-output (MIMO) system with 64TX 64RX (64T64R) chains, such as with multiple 4TX 4RX (4T4R) AFEs. Each 4T4R AFE is linked to the TX/RX transceiver baseband over a SerDes (serializer/deserializer) communications link, such as based on a SerDes standard like JESD204B or JESD204C.

As illustrated, the SerDes com link 50 interface is illustrated with three SerDes lanes for TX data, and one SerDes lane for RX data (including a feedback channel for FBRX data), consistent with the general throughput requirement that the TX interface rate is three times higher than the RX, to account for bandwidth expansion due to DPD, which, as noted, is in the range of 5× the TX Inband signal bandwidth. For example, considering a single TX chain at 750 MHz and 16 bits each for quadrature (IQ) modulation and JESD 8b/10b coding, the SerDes interface throughput requirement is approximately 30 Gbps, which, in current process technologies, corresponds to a single SerDes channel.

In brief overview, according to the Disclosure, signal compression for serialized data bandwidth reduction based on decomposition of a data signal into separate signal components with different SQNR or dynamic range requirements, and quantizing the signal components with different bit precisions. Compression logic decomposes the input data signal into the first/second signal components, quantizes the first component with a pre-defined first bit precision to provide a first quantized data signal, quantizes the second component with a pre-defined second bit precision to provide a second quantized data signal, the second bit precision less than the first bit precision, the first and second quantized data signals bit packed into a compressed digital data signal. At the receive-end, decompression logic bit unpacks the compressed digital data signal into the first/second quantized data signals, and filters/combines the first/second quantized data signals into a decompressed data signal corresponding to the input data signal including the first and second signal components. For an example wireless communication application, TX/DPD data is compressed based on decomposition into TX Inband and DPD expansion components, with the DPD component (with lower SQNR or dynamic range requirements) quantized with a lower bit precision.

Figure 2:
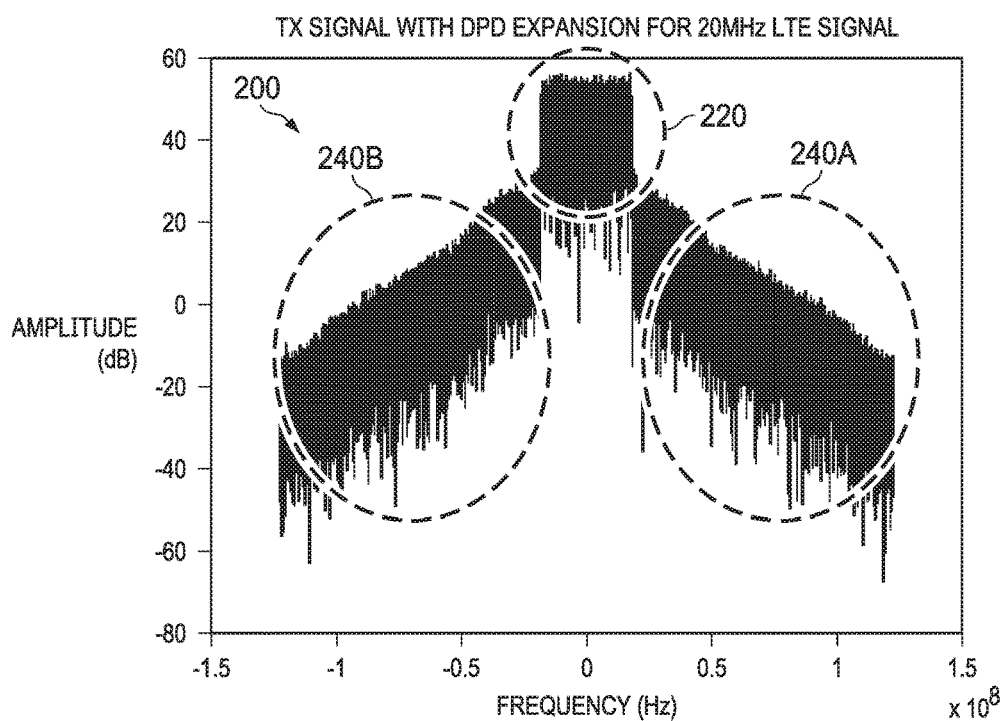
FIG. 2 illustrates an example TX spectrum for a 20 MHz LTE (Long Term Evolution) TX data signal 200 with TX Inband signal bandwidth 220, and DPD expansion skirt with upper and lower DPD signal bandwidth components 240A and 240B, illustrating an approximately 5× DPD expansion in signal bandwidth for the TX data signal.

FIG. 2 illustrates an example TX spectrum for a 20 MHz LTE (Long Term Evolution) TX/DPD data signal 200, with TX Inband signal bandwidth 220, and a DPD bandwidth expansion skirt with upper and lower DPD signal bandwidth components 240A and 240B.

The DPD bandwidth expansion 240A/B is approximately 5× the bandwidth of the TX Inband data signal 220. However, the power spectral density (PSD) of DPD expansion spectrum is in the range of 20-25 dB lower than the PSD of the TX Inband signal, with correspondingly lower SQNR and dynamic range requirements, so that a lower bit precision is used to quantize the DPD bandwidth expansion component.

According to the Disclosure, the TX/DPD spectrum is decomposed into TX Inband and the DPD expansion component data signals, and then quantized in separate data paths with a lower bit precision for the DPD expansion data component.

Figure 9:
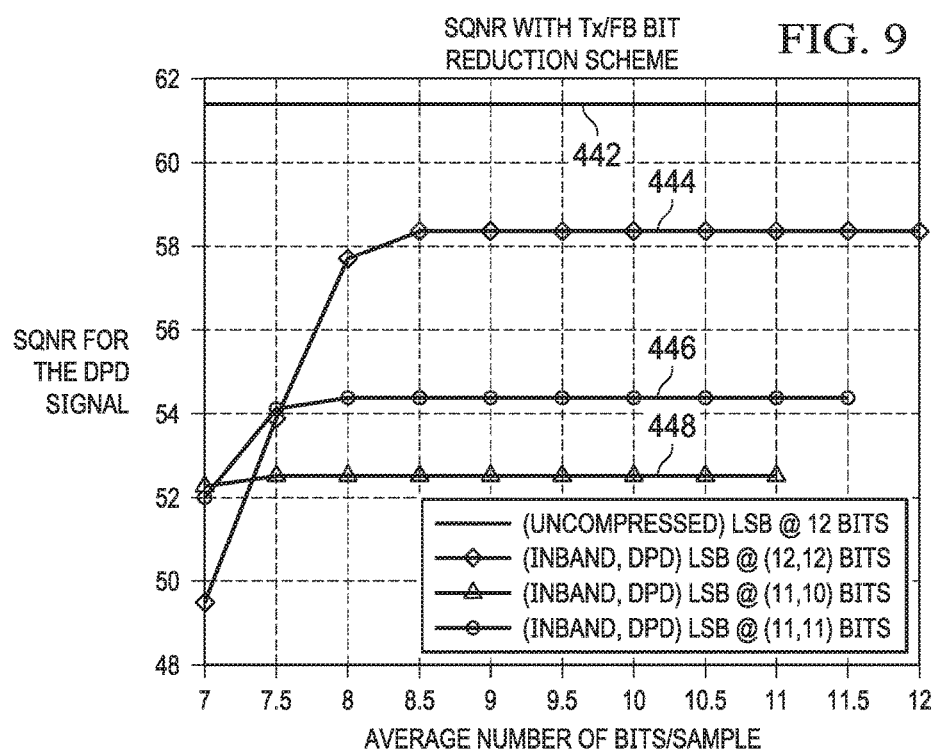
FIG. 9 provides example plots illustrating the use of different TX/DPD bit precisions to provide signal compression for serialized data bandwidth reduction according to the Disclosure, with SQNR plotted as a function of the average number of bits/sample, where the gain of the DPD expansion component is increased prior to quantization while keeping the LSB at a specified level (for example, 12 bits), the results illustrating that an average of 9 bits with 12 bits for the TX Inband component and approximately 6 bits for the DPD expansion component provides good SQNR performance.

Referring to FIG. 9, the example plots illustrate the use of different TX/DPD bit precisions to provide signal compression for serialized data bandwidth reduction according to the Disclosure. SQNR is plotted as a function of the average number of bits/sample, where the gain of the DPD expansion component is increased prior to quantization while keeping the LSB at a specified level (for example, 12 bits). The results illustrate that an average of 9 bits with 12 bits for the TX Inband component and approximately 6 bits for the DPD expansion component provides good SQNR performance.

Figure 3A:
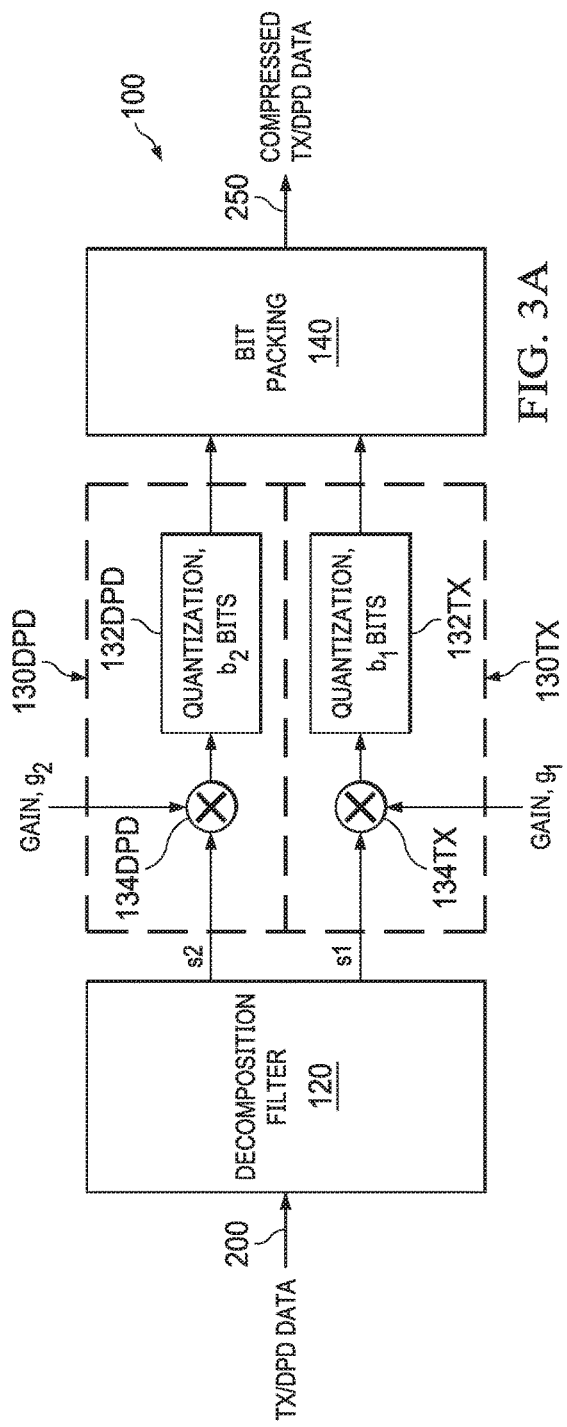
FIGS. 3A/3B and 4A/4B illustrate alternate example implementations for transmission over a SerDes com link with an example TX interface 100 and an example AFE interface 300, with signal compression/decompression for serialized data bandwidth reduction according to the Disclosure, such as can be used to compress TX/DPD data by decomposition into separate TX Inband and DPD expansion bandwidth components, and quantizing with different bit precisions for SerDes communication between a baseband TX and AFE.

FIGS. 3A/3B and 4A/4B illustrate alternate example implementations for a SerDes com link interface for the example wireless application providing serial data communication between a TX/RX transceiver (FIG. 1, 20, 22) with an example TX interface 100, and an AFE with an example AFE interface 300. The example TX and AFE interfaces provide signal compression and decompression for serialized transmit data bandwidth reduction according to the Disclosure, based on decomposition into separate TX In-Band and DPD expansion components, and quantizing in separate data paths with different bit precisions (specifically, a lower bit precision for the DPD expansion component).

FIG. 3A illustrates an example TX interface 100 including a decomposition filter 120 to decompose the TX/DPD baseband data into separate TX Inband and DPD expansion components s1 and s2. The TX/DPD components s1/s2 are processed in separate data paths 130TX and 130DPD.

Data paths 130TX and 130DPD include quantizers 132TX and 132DPD, and, in the example implementation, gain elements 134TX and 134DPD. According to aspects of the disclosure, quantizers 132TX and 132DPD quantize the TX/DPD signal components with separate bit precisions b1 and b2. In particular, the DPD expansion component s2 (with lower SQNR or dynamic range requirement) is quantized with a lower bit precision b2 than the TX Inband data quantized with bit precision b1 (which can be chosen based on the SQNR or dynamic range requirements for the TX Inband data).

The TX Inband data is multiplied by gain factor g1 to meet the quantization noise (SQNR) or dynamic range requirements of the application. Because the DPD expansion component has a lower PSD (on the order of −20 dB), or lower dynamic range, than the TX Inband data, the DPD component can be gained up by a factor g2 greater that g1, before quantization with the lower b2 bit precision, also to improve SQNR or dynamic range (which improves DPD nonlinearity cancellation at the PA output), and efficiently use the bits to represent the signal values. In addition, gaining up the lower-bit-precision DPD expansion component with a gain g2 greater than the gain g1 applied to the TX Inband data can be used to maintain the same signal resolution (LSB) for the quantized DPD component and the quantized TX Inband data, while using a (lower) bit precision b2 for the DPD component that is lower than the (higher) bit precision b1 for the TX Inband data. Alternatively, gaining up the lower-bit-precision DPD expansion component with a gain g2 greater than the gain g1 applied to the TX Inband data can efficiently use the signal swing represented by the lower bits b2. This quantization scaling function can be incorporated into the DPD data path quantizer 132DPD.

After quantization in the 130TX/130DPD data paths with different bit precisions b1 and b2 (including applying different gain factors g1 and g2), the quantized TX Inband and DPD expansion components are combined by bit packing 140. TX interface 100 outputs (to the SerDes com link) TX/DPD data 250 compressed according to the Disclosure.

Figure 3B:
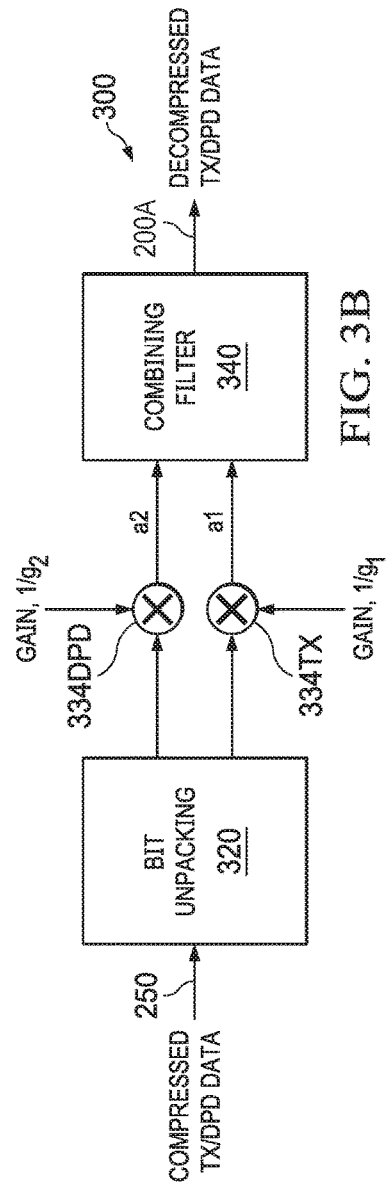

FIG. 3B illustrates an example AFE interface 300 to receive (over the SerDes com link) the compressed TX/DPD data 250, which is unpacked 320 into the separate TX and DPD data components a1 and a2. Consistent with the example TX interface 100 in FIG. 3A, The TX/DPD data components a1/a2 are separately scaled by 334TX/334DPD with gains 1/g1 and 1/g2 that are the inverse of the gains g1 and g2 applied in the TX data paths (FIG. 3A, 134TX/134DPD). The scaled TX/DPD data components a1/a2 are then combined 340 into decompressed (recovered) TX/DPD data 200, for input to the AFE signal chains.

FIGS. 4A and 4B illustrate alternate examples for TX interface 100 and AFE interface 300. These alternate implementations include format conversion (from IQ Cartesian) in the data paths. Except for the illustrative use of format conversion, the signal/data path designs in the example TX interface 100 and AFE interface 300 in FIGS. 4A/4B is the same as in FIGS. 3A/3B, including achieving bandwidth reduction based on quantization with different TX/DPD bit precisions, so the description here will focus on the format conversion feature.

Referring back to FIG. 1, signal compression according to the Disclosure, based on decomposition of a data signal into separate signal components with different SQNR or dynamic range requirements, and quantizing the signal components with different bit precisions, can also be used in the FBRX feedback channel. The RF TX signal from the PA 70 output, can be split into component signals and quantized with different bit precisions for communication back to the TX 22 (T(/RX 20) over the SerDes RX lane.

FIG. 4A illustrates an example TX interface 100 including decomposition 120 into separate TX (Inband) and DPD components s1 and s2, which are separately processed through 130TX and 130DPD data paths, including quantization 132TX and 132DPD with separate bit precisions b1 and b2 after, in this example, being gained up 134TX/g1 and 134DPD/g2. After the example format conversion (such as floating point or polar), the resulting quantized TX/DPD data signals s1/s2 are combined by bit packing 140 to output a compressed TX/DPD data stream (such as for transmission over a SerDes com link).

FIG. 4B illustrates an example AFE interface 300 to receive the compressed TX/DPD data 250, which is unpacked 320 into the separate TX and DPD data components a1 and a2. After format reconversion 334TX/334DPD (to Cartesian), the TX/DPD data components are scaled by 334TX/334DPD with gains 1/g1 and 1/g2 that are the inverse of the gains g1 and g2 applied in the TX data paths (FIG. 4A, 134TX/134DPD). The scaled TX/DPD data components a1/a2 are then combined 340 into decompressed (recovered) TX/DPD data 200, for input to the AFE signal chains.

Figure 5A:
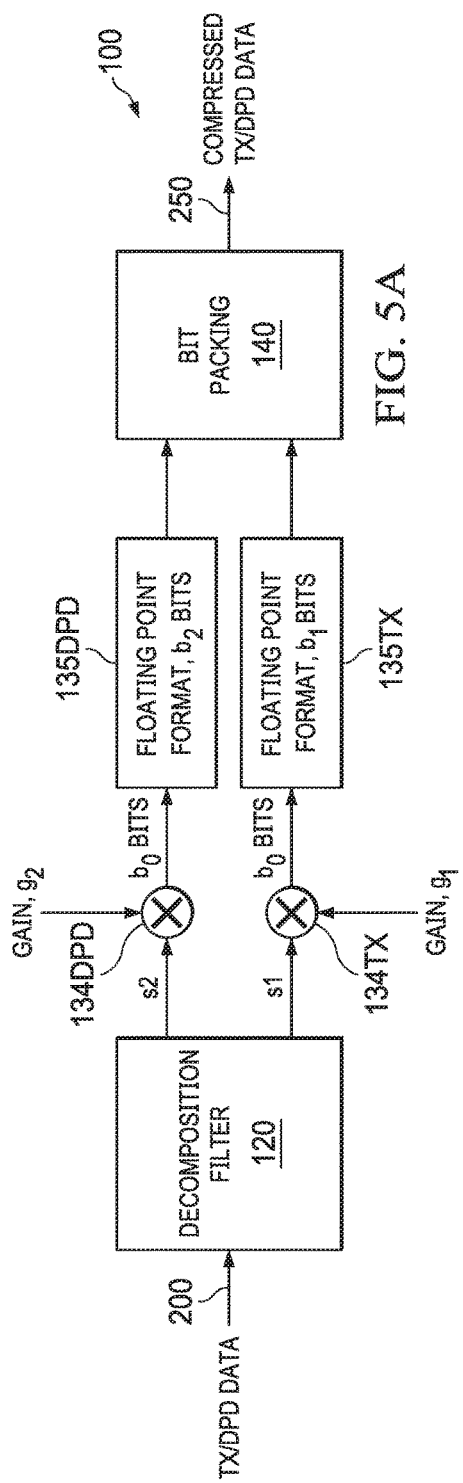
FIGS. 5A and 5B illustrate an example implementation of TX interface 100 and AFE interface 300 of FIGS. 4A and 4B with format conversion from IQ Cartesian to a floating point representation.

FIGS. 5A/5B and 6A/6B illustrate example implementations of the TX interface 100 and AFE interface 300 of FIGS. 4A and 4B, with format conversion from IQ Cartesian to (5A/5B) floating point, and (6A/6B) polar.

Figure 5B:
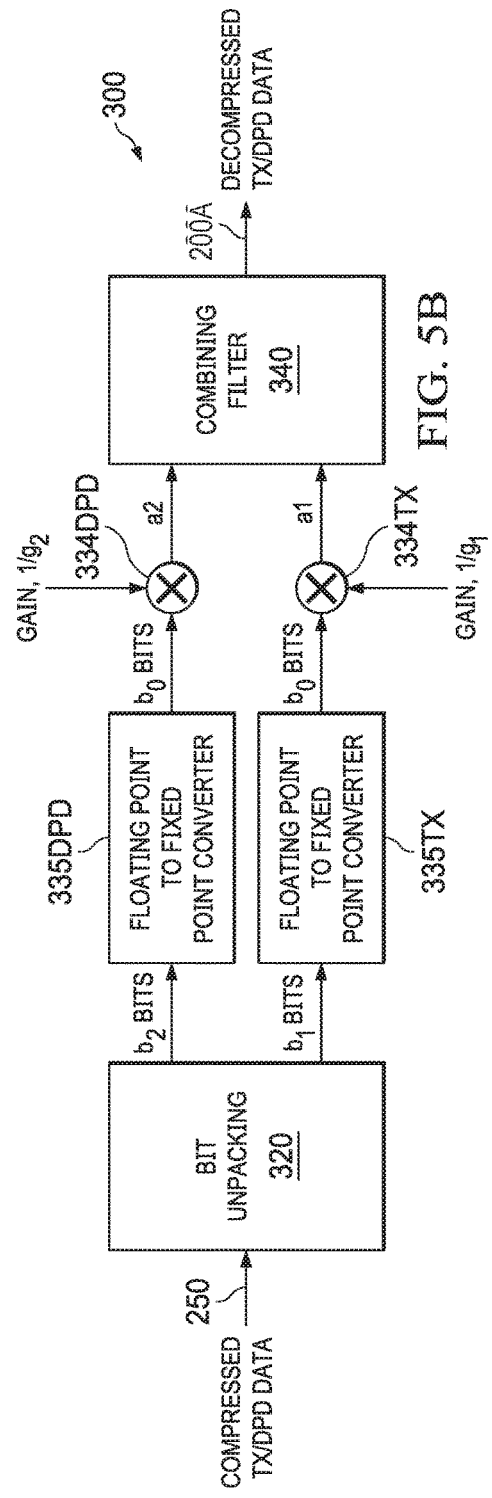

FIGS. 5A and 5B illustrate an example implementation of TX interface 100 and AFE interface 300 of FIGS. 4A and 4B with format conversion from IQ Cartesian to a floating point representation.

Referring to FIG. 5A, in TX interface 100, after decomposition 120, the TX/DPD component signals s1 and s2 are input to separate data paths with gain 134TX/134DPD, and quantization in floating point format 135TX/135DPD, with bit precisions b1 and b2.

After format conversion, the b1 bits in signal s1 comprise e1 bits for the exponent and m1 bits for the mantissa. Similarly, after format conversion, the b2 bits in signal s2 comprise e2 bits for the exponent and m2 bits for the mantissa, for example, using 2 bits for exponent and the remainder for mantissa (when exponent is higher than the min value, the MSB need not be transmitted). The floating point representation can provide a bit more quantization advantage than other formats (such as fixed Cartesian and polar).

After multiplication 134TX/134DPD by the gain factors g1/g2, the TX/DPD component signals s1/s2 are represented in $b_0$ bits, and input to 135TX/135DPD for format conversion and quantization. After format conversion, the floating point data TX e1/m1 and DPD e2/m2, are quantized with different bit precisions b1 and b2. The quantized TX/DPD data is then packed for output as compressed TX/DPD data.

Referring to FIG. 5B, in AFE interface 300, the floating point parameters e1, e2, m1 and m2 are used for format reconversion. The compressed TX/DPD data 250 is unpacked 320, and the TX/DPD signals with bit precisions b1/b2 are input to floating-point-to-fixed-point converters 335TX/335DPD, which converts the TX/DPD data with b1/b2 bits in floating point format to a two's complement TXDPD data a1/a2 with bit precision $b_0$. The TX/DPD data components a1/a2 are then combined 340 to generate (recover) the decompressed TX/DPD data 200.

Figure 6A:
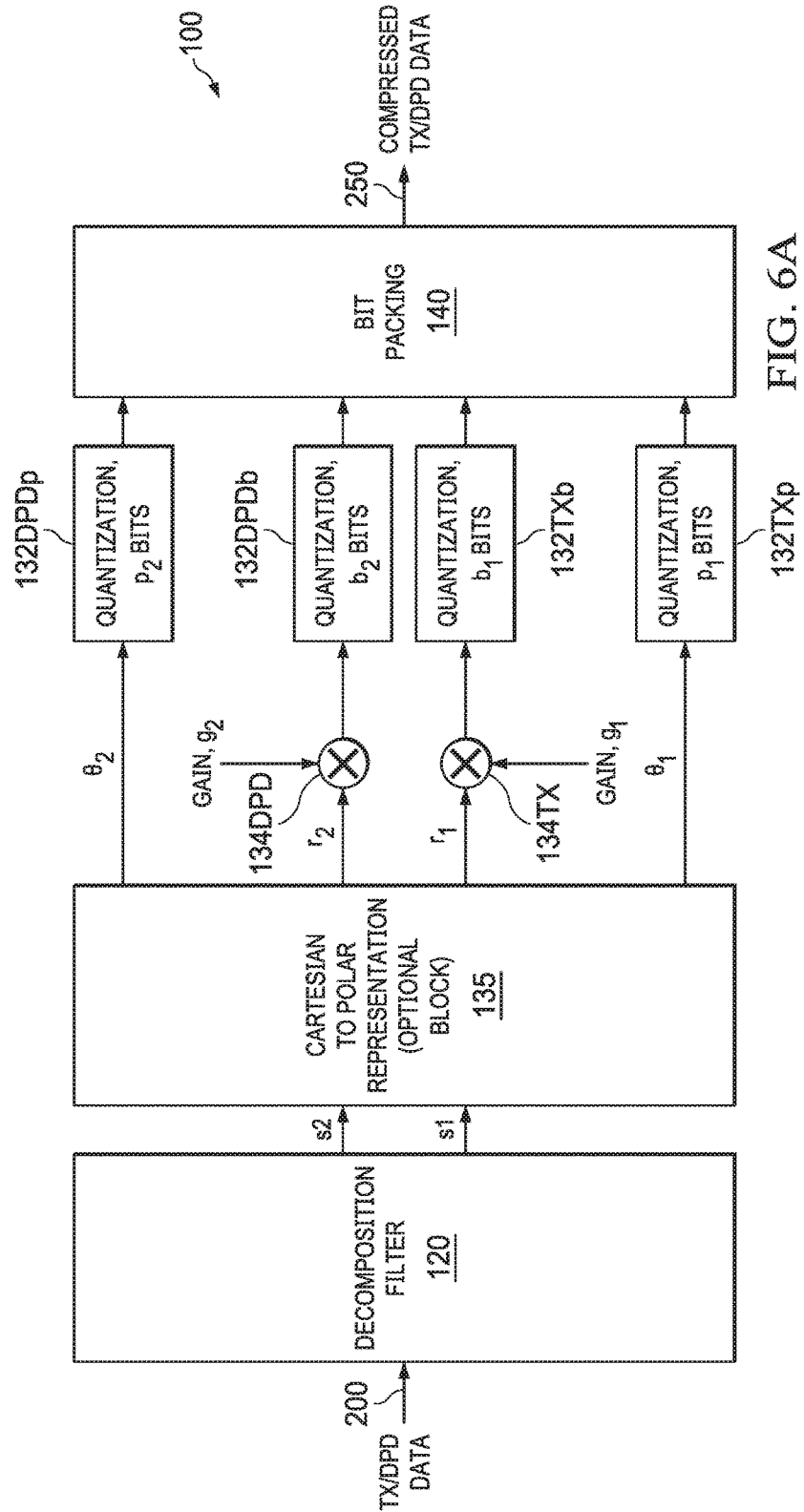

FIGS. 6A and 6B illustrate an example implementation of TX interface 100 and AFE interface 300 of FIGS. 4A and 4B with format conversion from IQ Cartesian to a polar representation.

Referring to FIG. 6A, in the TX interface 100, the input TX/DPD data 200 is decomposed 120 to TX/DPD component signals s1 and s2, which are complex IQ signals. These decomposed TX/DPD IQ data components are input to a Cartesian to polar format converter 135 for conversion to a polar representation with radial and phase (r, θ). The radial $r_1/r_2$ signals are multiplied 134TX/134DPD by gain factors g1 and g2, and then quantized 132TXb/132DPDb with bit precisions $b_1$ and $b_2$ ($b_2<b_1$). The phase signals, $\theta_1$ and $\theta_2$ are quantized with bit precisions $p_1$ and $p_2$ bits.

The quantized TX($r_1$, $\theta_1$) and DPD($r_2$, $\theta_2$) are then bit packed 140 to generate the compressed TX/DPD data 250, for communication over a SerDes com link.

Referring to FIG. 6B, in the AFE interface 100, the polar parameters $r_1$, $\theta_1$, $r_2$, $\theta_2$ are used for format reconversion. The compressed TX/DPD data 250 is unpacked 320 to generate TX($r_1$, $\theta_1$,) and DPD($r_2$, $\theta_2$) component signals. The radial TX/DPD $r_1/r_2$ components are scaled using the inverse gain factors 1/g1 and 1/g2. The scaled TX/DPD $r_1/r_2$ components and the TX/DPD $\theta_1/\theta_2$ components are then format converted 335 to Cartesian (I,Q) TX/DPD signals a1/a2. The TX/DPD a1/a2 component signals are then combined 340 to regenerate the decompressed TX/DPD data 200 for input to the AFE signal chains.

If the input TX/DPD data is an OFDM (Orthogonal Frequency Division Multiplexing) signal, then commonly, it is backed off to account for the peak power to average power ratio. In a polar representation, this back-off is contained in the TX/DPD $r_1/r_2$ signals, which can be multiplied by gains g1 and g2, which takes advantage of this back-off to optimize SQNR, or to efficiently use the dynamic range of the values represented by bits used to quantize the $r_1/r_2$ signals.

Figure 7C:
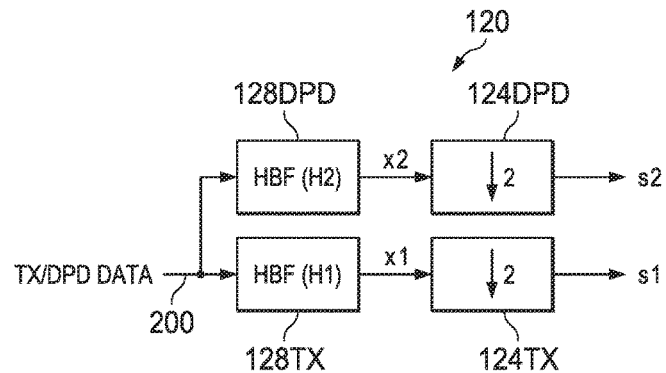

FIGS. 7A, 7B, 7C illustrate example implementations for decomposition filtering for use in the example TX interface 100 of FIGS. 3A, 4A. 5A, 6A (120).

Figure 8A:
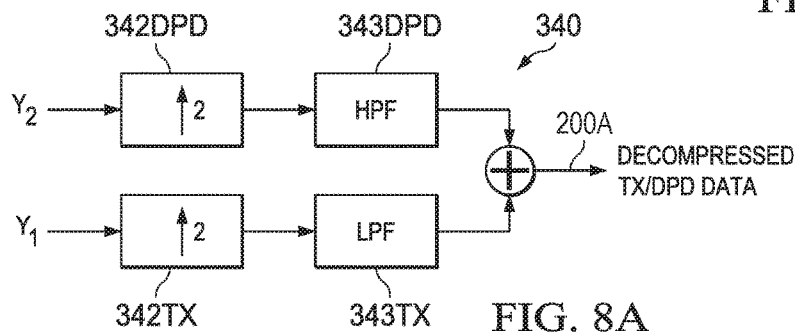
FIGS. 8A, 8B, 8C illustrate example implementations for combining filtering for use in the example AFE interface 300 of FIGS. 3B, 4B, 5B, 6B (340).
Figure 8B:
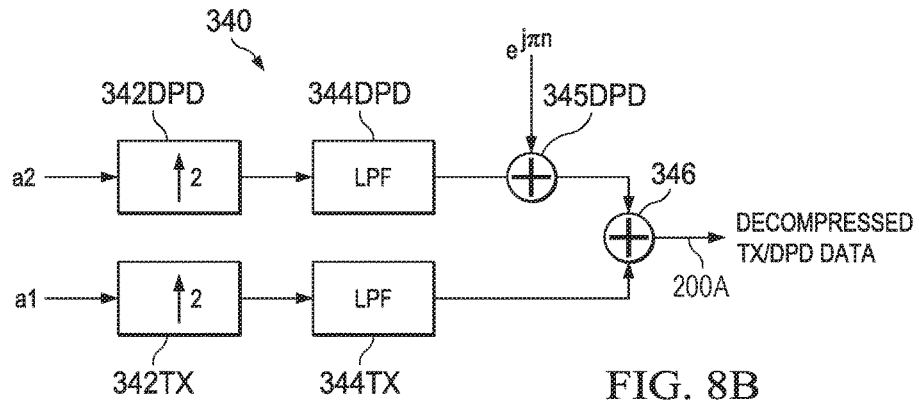
Figure 8C:
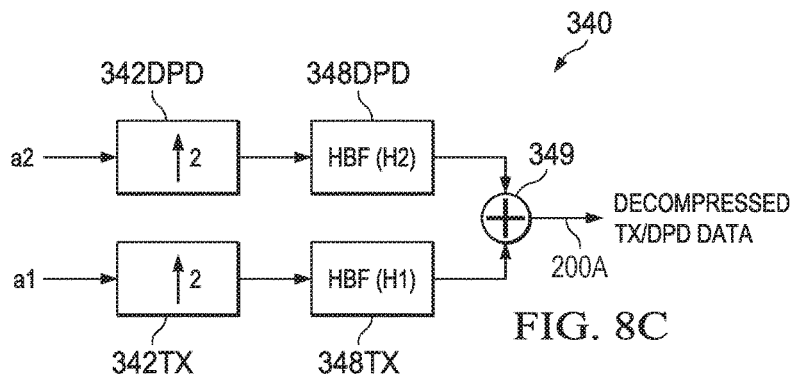

FIGS. 8A, 8B, 8C illustrate example implementations for combining filtering for use in the example AFE interface 300 of FIGS. 3B, 4B, 5B, 6B (340).

Referring to FIG. 7A, in the TX interface, decomposition 120 can be implemented with low and high pass filters TX LPF 122TX and DPD HPF 122DPD, providing decomposed TX/DPD data components x1/x2, which are then down-sampled to reduce the throughput requirement for transmission. For example, The down-sampling by a factor of 2 represents the operation of selecting one sample out of 2 samples at the input.

Referring to FIG. 7B, decomposition 120 can be implemented by low pass filtering 123TX the input TX/DPD data 200 to generate the TX component x1, and generating the DPD component x2 by subtracting the TX LPF output from the a delayed 126DPD version of the input TX/DPD data. The TX/DPD x1/x2 components are then down-sampled (such as x2) to reduce the throughput requirement for their transmission.

Referring to FIG. 7C, decomposition 120 can be implemented using half-band filters HBF (H1) 128TX and HBF (H2) 128DPD. For HBF (H1), let H1(z) represent the z-transform, which satisfies the property, $H1(z)+H1(-z)=1$. Thus, the half-band filters are H1(z) and $H2(z)=H1(-z)$, which can be used as the decomposition filters 128TX/128DPD to generate the TX/DPD component signals x1/x2. These TX/DPD components x1/x2 are down-sampled 124TX/124DPD by a factor of 2 to generate the TX/DPD component signals s1 and s2 which are then quantized by different bit precisions (b1/b2).

Referring to FIG. 8A, in the AFE interface, after unpacking, the TX/DPD data components a1/a2 are combined 340 to restore the composite TX/DPD signal with TX Inband and DPD expansion components. Combining can be accomplished by up-sampling 342TX/342DPD (corresponding to the down sampling during decomposition in the TX interface), and then low pass filtering 343TX the TX component a1 and high pass filtering 343DPD the DPD component a2. For example, if in the TX interface, the input TX/DPD data down-sampled by a factor of 2, then in the AFE, TX/DPD components are combined with up-sampling by a factor of 2 (where, up-sampling by a factor N implies inserting N−1 zeros between every sample of the input).

Referring to FIG. 8B, in the AFE interface, combining 340 can be implemented by using the low pass filter (LPF) used as the example decomposition filter of FIG. 7B. If the sampling frequency of signals a1/a2 is fs/2, then, after up-sampling 342TX/342DPD, the up-sampled TX/DPD components a1/a2 are filtered by the LPF 344TX/344DPD, and the filtered DPD component a2 is then up-converted 345DPD to fs/2, and then added 346 to the filtered TX component a1 to generate the decompressed TX/DPD data 200, for input to the AFE signal chains.

Referring to 8C, in the AFE interface, combining 340 can be implemented up-sampling 342TX/342DPD, and then using half-band filters HBF H1/H2 348TX/348DPD as used in the example decomposition filter illustrated in FIG. 7C, where $H1(z)$ and $H2(z)=H1(-z)$. The filtered TX/DPD components are then combined (summed) 349 to generate the decompressed TX/DPD data 200, for input to the AFE signal chains.

FIG. 9 provides example plots 444, 446, 448, illustrating the use of different TX/DPD bit precisions (legend) to provide signal compression for serialized data bandwidth reduction according to the Disclosure. SQNR is plotted as a function of the average number of bits/sample, where the gain of the DPD expansion component is increased prior to quantization while keeping the LSB at a specified level (for example, 12 bits). The results illustrate that an average of 9 bits, with 12 bits for the TX Inband component and approximately 6 bits for the DPD expansion component, provides good SQNR performance.

An advantage of the disclosed technique for signal compression to reduce communication bandwidth requirements based on decomposition of a data signal into separate signal components with different SQNR (or dynamic range) requirements, and quantizing the signal components with different bit precisions, is that it achieves signal compression (throughput reduction) without reducing the bit precision of the TX Inband signal, which increases quantization noise, degrading SQNR.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A communications link, including a transmit end and a receive end, comprising:

at the transmit end, a transmit interface including:
   a data input to receive an input data signal with at least first and second signal components with respectively a higher and a lower signal to quantization noise ratio (SQNR) requirement or dynamic range requirement;
   compression logic including:
      decomposition logic to decompose the input data signal into the first and second signal components,
      quantization logic to quantize the first signal component with a defined first bit precision to provide a first quantized data signal, and to quantize the second signal component with a defined second bit precision to provide a second quantized data signal, the second bit precision less than the first bit precision, and
      bit-packing logic to assemble the first and second quantized data signals into a compressed digital data signal;

at the receive end, a receive interface including:
   a communication input to receive the compressed digital data signal;
   decompression logic including:
      bit unpacking logic to separate the compressed digital data signal into the first and second quantized data signals; and
      combining filter logic to combine the first and second quantized data signals into a decompressed data signal corresponding to the input data signal including the first and second signal components.

2. The link of claim 1, wherein:
the compression logic further includes gain logic to apply a first gain to the first signal component, and a second gain to the second signal component, where the second gain is greater than the first gain; and
the decompression logic further includes scaling logic to apply to the first quantized data signal a first inverse gain corresponding to an inverse of the first gain, and to apply to the second quantized data signal a second inverse gain corresponding to an inverse of the second gain.

3. The link of claim 1, wherein:
the compression logic further include format conversion logic to convert the first and second signal components from a first format to a second format;
the decompression logic further includes format reconversion logic to convert the first and second quantized data signals from the second format to the first format.

4. The link of claim 3, the second format is one of: a floating point format, or a polar format.

5. The link of claim 1, wherein:
the decomposition logic includes down-sampling the first and second signal components; and
the combining filter logic includes up-sampling the first and second quantized data signals.

6. The link of claim 5, wherein:
the decomposition logic includes one of low pass filter logic or half-band filter logic; and
the combining filter logic includes one of low pass filter logic or half-band filter logic.

7. The link of claim 1, wherein the communications link is for radio frequency communications, and wherein the input data signal is a baseband digital data signal, and wherein:
the first signal component is a transmit (TX) inband signal component; and the second signal component is a digital pre-distortion (DPD) signal component based on digital pre-distortion of the TX inband signal component.

8. The link of claim 1, wherein the communications link is for radio frequency communications, and wherein:
the transmit interface is included in a digital baseband transmitter:
the digital baseband transmitter to generate the input data signal as an input baseband data signal, and
the compression logic to generate a compressed baseband digital data signal;
the receive interface is included in a front-end unit coupled to a radio frequency transmitter:
the decompression logic to convert the compressed baseband digital data signal to a decompressed baseband digital data signal, for input to the radio frequency transmitter,
the front-end unit including radio frequency conversion circuitry to convert the decompressed baseband digital data signal to an analog radio frequency signal, and
the radio frequency transmitter to receive the analog radio frequency signal for transmission as a radio frequency wireless transmission;
wherein the front-end unit and the radio frequency transmitter are configured as one of: (a) separate analog front-end integrated circuitry, and radio frequency transmitter integrated circuitry, or (b) a radio frequency transmitter integrated circuit including the front-end unit as an analog front end to the radio frequency transmitter.

9. The link of claim 1, wherein the communications link communicates the compressed digital data signal as a serial compressed digital data signal.

10. An analog front end (AFE) for use in a radio frequency communications system including a digital baseband transmitter interfaced at a transmit end to a communications link, the transmitter to generate a compressed baseband digital data signal, the AFE comprising:
a receive interface including an input communication port to interface at a receive end to the communications link;
the receive interface configured to receive through the input communication port the compressed baseband digital data signal generated by the transmitter and communicated over the communications link;
the compressed baseband digital data signal generated from a baseband discrete data signal that includes a transmit (TX) inband signal component, and a digital pre-distortion (DPD) signal component based on digital pre-distortion of the TX inband signal component,
the TX inband signal component quantized with a defined first bit precision to provide a TX quantized data signal, and
the DPD signal component quantized with a defined second bit precision to provide the DPD quantized data signal,
the second bit precision less than the first bit precision, and
the compressed baseband digital data signal generated with the TX inband and DPD quantized data signals;
decompression logic including
bit unpacking logic to separate the compressed baseband digital data signal into the TX inband and DPD quantized data signals;
combining filter logic to filter the TX inband and DPD quantized data signals into TX inband and DPD filtered data signals, combined into a decompressed baseband digital data signal corresponding to the baseband digital data signal including the TX inband and DPD signal components; and
radio frequency conversion circuitry to convert the decompressed baseband digital data signal to an analog radio frequency signal corresponding to the baseband discrete data signal including the TX inband and DPD signal components.

11. The AFE of claim 10, wherein the compressed baseband digital data signal is generated with a first gain applied to the TX inband signal component, and a second gain applied to the DPD signal component, where the second gain is greater than the first gain, the decompression logic further including:
scaling logic to apply to the TX quantized data signal a first inverse gain corresponding to an inverse of the first gain, and to apply to the DPD quantized data signal a second inverse gain corresponding to an inverse of the second gain.

12. The AFE of claim 10, wherein the compressed baseband digital data signal is generated with conversion of the TX inband and DPD signal components from a first format to a second format, the decompression logic further including:
format reconversion logic to convert the TX inband and DPD quantized data signals from the second format to the first format
wherein the second format is one of: a floating point format, or a polar format.

13. The AFE of claim 10, wherein the compressed baseband digital data signal is generated with the TX inband and DPD signal components down-sampled prior to quantization, wherein:
the combining filter logic includes up-sampling the TX inband and DPD quantized data signals.

14. The AFE of claim 10, wherein:
the combining filter logic includes one of low pass filter logic or half-band filter logic.

15. The AFE of claim 10, wherein the communications link communicates the compressed baseband digital data signal as a serial compressed baseband digital data signal.

16. The AFE of claim 10, wherein the digital baseband transmitter includes:
compression logic including
decomposition logic to decompose the base band discrete data signal into the TX inband and DPD signal components;
quantization logic to quantize the first signal component with a defined first bit precision to provide a first quantized data signal, and to quantize the second signal component with a defined second bit precision to provide a second quantized data signal, the second bit precision selected to be less than the first bit precision;
bit-packing logic to assemble the first and second quantized data signals into a compressed baseband digital data signal; and
at least one of:
in the compression logic, gain logic to apply a first gain to the TX inband signal component, and a second gain to the DPD signal component, where the second gain is greater than the first gain;
in the compression logic, format conversion logic to convert the TX inband and DPD signal components from a first format to a second format;

in the decomposition logic, down-sampling the TX inband and DPD signal components; and in the decomposition logic, one of low pass filter logic or half-band filter logic.

17. A method of communicating digital data over a communications link, including a transmit end and a receive end, comprising:

at the transmit end:
receiving an input data signal with at least first and second signal components with respectively a higher and a lower signal to quantization noise ratio (SQNR) requirement or dynamic range requirement;

decomposing the input data signal into the first and second signal components, quantizing the first signal component with a defined first bit precision to provide a first quantized data signal, and quantizing the second signal component with a defined second second bit precision to provide a second quantized data signal, the second bit precision less than the first bit precision, and bit-packing the first and second quantized data signals into a compressed digital data signal;

at the receive end:
receiving the compressed digital data signal;
bit-unpacking the compressed digital data signal into the first and second quantized data signals; and
combining the first and second quantized data signals into a decompressed data signal corresponding to the input data signal including the first and second signal components.

18. The method of claim 17, wherein:

at the transmit end:
applying a first gain to the first signal component, and a second gain to the second signal component, where the second gain is greater than the first gain; and at the receive end:
scaling the first quantized data signal with a first inverse gain corresponding to an inverse of the first gain, and scaling the second quantized data signal with a second inverse gain corresponding to an inverse of the second gain.

19. The method of claim 17, wherein:

at the transmit end:
converting the first and second signal components from a first format to a second format;

at the receive end:
convert the first and second quantized data signals from the second format to the first format.

20. The method of claim 17, wherein:

at the transmit end:
down-sampling the first and second signal components; and at the receive end:
up-sampling the first and second quantized data signals.

21. The method of claim 17, wherein:

the input data signal is a baseband digital data signal;

the first signal component is a transmit (TX) inband signal component; and the second signal component is a digital pre-distortion (DPD) signal component based on digital pre-distortion of the TX inband signal component; and the compressed digital data signal is a compressed baseband digital data signal.

22. The method of claim 17, wherein the communications link communicates the compressed digital data signal as a serial compressed digital data signal.

* * * * *